OFFSET PRINTING PLATES

Filed July 5, 1966

INVENTORS
MICHAEL N. GIANGUALANO
IRVIN W. MARTENSON
LAWRENCE H. OTT
BY
Milton Zucker
Dennis Greene
Robert D. Jackson United States Patent Office 3,462,267 Patented Aug. 19, 1969

3,462,267

OFFSET PRINTING PLATES

Michael N. Giangualano, Fullerton, Irvin W. Martenson, Pacific Palisades, and Lawrence H. Ott, Pasadena, Calif., assignors to Dynachem Corporation, Downey, Calif., a corporation of Delaware Continuation-in-part of application Ser. No. 229,605, Oct. 10, 1962. This application July 5, 1966, Ser. No. 562,691
Int. Cl. G03f *7/10;* B41m *1/06*
U.S. Cl. 96—33 5 Claims

ABSTRACT OF THE DISCLOSURE

An offset printing plate is produced by exposing to light a photographic element comprising a base coated with a sensitized prepolymer of an aryl allyl ester resin. The base is the type capable of holding water when treated with lithographic etch solution. The resin is hardened in the exposed areas which constitute the printing surface. Unhardened resin is dissolved from the non-image areas.

Figure 1:
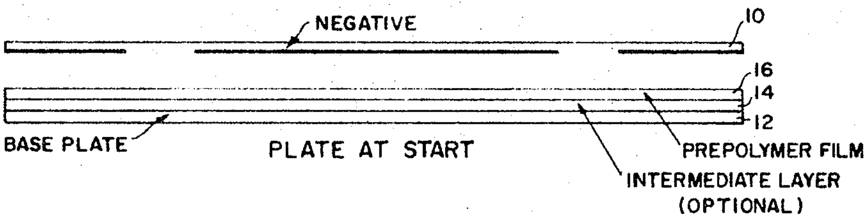

This application is a continuation-in-part of application Ser. No. 229,605 filed Oct. 10, 1962, and now abandoned in favor of a continuation thereof, Ser. No. 539,-236 filed Feb. 1, 1966, now Patent No. 3,376,139.

This application is concerned with the printing art and is directed particularly to plates for use in lithographic printing, characterized by the fact that the raw plates of this invention can be stored over long periods of time and retain their photosensitivity, and can nevertheless be converted by simple techniques, similar to those now used for the preparation of lithographic printing plates, into such plates which are characterized by sharp definition and by very long life in service, in the range from 100,000 to 500,000 and more impressions.

In our co-pending applications Ser. No. 229,605 and Ser. No. 539,236 we have disclosed and claimed as photosensitive resists for metal, compositions comprising a sensitizing agent which is activable by actinic radiation, and prepolymers of aryl allyl esters having more than one allyl group, which prepolymers are essentially solvent-soluble, solid at ambient temperatures, and contain at most very small percentages of the monomers from which they are produced, so that they undergo very little shrinkage when further cross-linked by actinic radiation. In application Ser. No. 328,828, now Patent No. 3,376,138, we have described and claimed similar photosensitive resist compositions containing allied prepolymers of allyl esters having more than one allyl group, and certain copolymers thereof, and the use of these compositions for the purpose of making presensitized plates for lithographic printing. This application describes and claims the use of the compositions described and claimed in our co-pending applications Ser. No. 229,605 and Ser. No. 539,236, as applied to the field of lithographic printing.

We have discovered that when the photographic resists of that invention (i.e., those comprising a prepolymer of an aryl allyl ester having more than one allyl group, which is solvent-soluble and solid at ambient temperatures and which, because of its low monomer content, undergoes very little shrinkage when further cross-linked by actinic radiation, and a sensitizing agent which upon absorbing actinic radiation at room temperature accelerates polymerization of said prepolymer) are applied to base plates whose surface can be treated by ordinary techniques to produce a hydrophilic surface, the resultant structures are highly useful as presensitized lithographic printing plates.

The fully cured polymer is highly organophilic and ink-receptive, and surprisingly and most unexpectedly shows excellent resistance to abrasion, being capable of withstanding hundreds of thousands of impressions in a typical offset printing operation. Moreover, these aryl allyl ester prepolymer compositions are surprisingly resistant to polymerization in storage, despite the fact that they can be rapidly converted to the insoluble stage by actinic radiation, so that there is very little tendency for the coatings to harden and become insoluble over prolonged storage periods. This makes possible the production of presensitized lithographic printing plates which are both storage-stable over long periods of time, and at the same time are capable of producing plates with very long press life, generally equivalent in performance to the best deep-etch lithographic plates currently available, which require much more difficult and expensive production methods.

The basic constituent of our resist coating is a prepolymer of an aryl allyl ester having two or more allyl groups, in combination with an initiator or sensitizing agent. The aryl group may be a simple ring (e.g. phenyl, cyanurate) or a condensed ring (e.g. naphthyl). Typical of the monomers which can be used to produce the desired prepolymers are, for example, diallyl isophthalate, diallyl terephthalate, triallyl cyanurate, triallyl mellitate, tetraallyl pyromellitate, and similar compounds.

In the manufacture of prepolymers, the monomeric materials are polymerized in conventional fashion to produce a solution of a soluble polymer in the monomer, to a point short of gelation, which occurs when the molecular weight of the polymer gets to the point where it becomes insoluble in the monomer. These polymer solutions (called "dopes") are then separated into a solvent soluble prepolymer fraction, and monomer. This may be done by treatment with a solvent which dissolves the monomer while precipitating the polymer, or by other means which will leave a soluble prepolymer substantially free of monomer. A typical method for separating such polymers is described in Willard U.S.P. 3,030,341 issued Apr. 17, 1962. These prepolymers are solids containing little or no monomer; they can be stored indefinitely in this form, since they require catalysts and either heat or actinic light to convert them to the insoluble stage.

In order to obtain coatings which polymerize sufficiently rapidly in the presence of actinic light to be commercially useful, it is necessary to add to the prepolymer a sensitizing agent which absorbs actinic radiation so as to dissociate into free radicals which accelerate complete polymerization of the prepolymer. The sensitizing agent can be ethers of benzoin, such as methyl ether of benzoin; p,p′-substituted benzophenones such as 4,4′-bis(dimethylamino) benzophenone and 4,4′-bis(diethylamino) benzophenone; or bis(1-anthraquinonyl amino) anthraquinones such as 1,4-bis(1-anthraquinoyl amino) anthraquinone and 1,5-bis(1-anthraquinonyl amino) anthraquinone, and combinations thereof. Other useful sensitizing agents include polynuclear quinones such as 1,2-benzanthraquinone and 2-methyl anthraquinone; mononuclear quinones such as 2,5-diphenyl-p-quinone; aromatic α-diketones such as benzil; substituted aryl methylene dioxy compounds such as piperanol, piperoin, 3,4-methylene dioxychalcone, and 5,6-methylene dioxyhydrindone-1; substituted β-naphthoselenazolines such as 1 - methyl - 2 - acetyl methylene - β - naphthoselenazoline; substituted β-benzothiazolines such as 3-methyl-2-benzoyl methylene benzothiazoline; substituted β-naphthothiazolines such as 1-methyl-2-menzoyl methylene-β-naphthothiazoline; anthrones such as anthrone; benzanthrones such as benz-2-ethylbenzanthrone and 7-H-benz(de)-anthracen-7-one; and azabenzanthrones such as 2-keto-3-methyl-1,3-diazabenzanthrone.

The conecentration of sensitizer in the photo resist composition depends upon the sensitive polymeric compound, i.e. the aryl polyallyl prepolymer, present. In the case of the prepolymer of diallyl isophthalate, from about 1 to 20%, preferably 1.5 percent by weight of prepolymer, of 1,4-bis(1-anthraquinonyl amino)anthraquinone can be used. Some sensitizers, such as p,p'-substituted benzophenones, e.g. 4,4'-bis(dimethylamino) benzophenone, in an amount less than 1.5%, cause a considerable increase in sensitivity to actinic light. The sensitizer is excited by the actinic radiation, and, in turn, initates the polymerization. The mechanism of the reaction is believed to be that the sensitizer dissociated into free radicals by the actinic radiation or energy that it absorbs, and the resulting free radicals initiate cross-linking of the prepolymer to render it insoluble.

The addition of the sensitizer to the allyl prepolymers increases their reactivity to actinic rays as much as 100 to 200 times. On exposure the films polymerize sufficiently rapidly so that they can be used in conventional plate making procedures.

The use of the prepolymer substantially free of monomer assures that the light-sensitive coating, once it is free of the solvent used to spread it as a film, will yield a non tacky coating, which will not shrink during cross-linking and insolubilization of the prepolymer when it is exposed to actinic rays. As a result, faithful reproduction of the art work used in preparing a plate can be assured.

Figure 2:
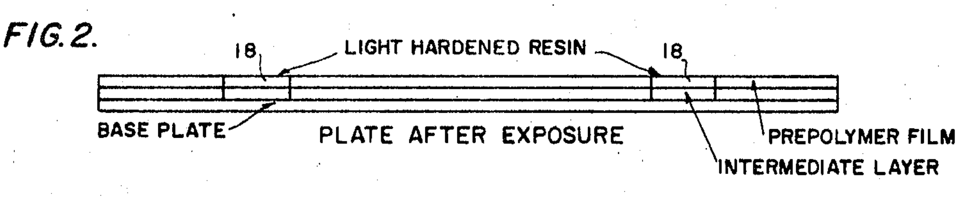
Figure 3:
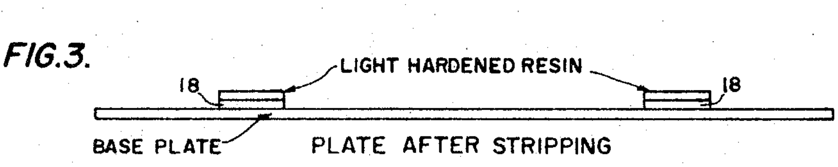
Figure 4:
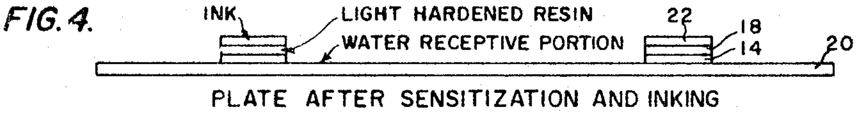

The accompanying drawings are useful in following the procedures used in making lithographic printing plates from the base materials. In these drawings, FIGURE 1 shows the plate at the start of the platemaking operation with a photographic negative above it. FIGURE 2 shows the plate after exposure before removal of the unhardened soluble prepolymer film. FIGURE 3 shows the plate after it has been stripped ready for inking. FIGURE 4 shows the plate ready for the press.

In practicing this invention, we use a base material, the surface of which can be sensitized to accept the aqueous solutions used to keep the non-working areas of conventional lithographing plates clean during the lithographing operation. Preferred materials are very thin metal surfaces, in particular aluminum and zinc, which are generally grained chemically or mechanically so that they will retain the aqueous fluid in a more satisfactory manner. It is essential for long runs that a metal plate be used. Where long runs are not desired, coated paper and various plastics and foils have been used. Although the photosensitive compositions herein may be applied directly to the base material, firmer adherence thereto of the photosensitive coating can be attained by interposing a bonding or intermediate layer between the surface of the base material and the photosensitive coating. Such layers must exhibit a strong affinity both for the surface of the base material and the photosensitive coating. At the same time they must be capable of accepting the aqueous solutions commonly used in maintaining the non-working areas of conventional lithographic plates clean during the lithographing operation. Materials which we have found to possess the afore-delineated characteristics to a marked extent are intermediate layers formed of urea formaldehyde polymers, the anodized layer on anodized aluminum plates and diazo coatings of the type described in USP 2,714,066.

The plate, either with or without an intermediate layer, is then coated with a thin film of the desired prepolymer in a suitable organic solvent using any technique which will produce a uniform film. These prepolymers are soluble in toluene and other aromatic halogenated hydrocarbons, ketones, and certain of the ester solvents. Any solvent can be used which dissolves the ingredients and can be readily removed. Once the solvent is removed from the film, we have a presensitized plate which can be stored indefinitely under normal storage conditions and processed into finished printing plates at the convenience of the user. These plates comprise a thin sheet of material whose surface is adapted to be processed to take a lithographic damping solution and a film of the prepolymer of aryl allyl esters having two or more allyl groups, containing a photosensitizing agent in sufficient concentration to make the film rapidly photosensitive.

As shown in FIGURE 1, a negative 10 of the subject to be printed is put into place with the plate which comprises a base 12, an optional intermediate layer 14, and the sensitized prepolymer layer 16. The plate is exposed to actinic light through the negative for long enough to harden the prepolymer film, at which point the plate is as shown in FIGURE 2, with light-hardened portions 18 where the negative was transparent and with solvent soluble portions where the negative was opaque.

It is sometimes desirable to put a small amount of dyestuff in the coating for use in following the further processing. This dyestuff may be light-sensitive if desired, so that after exposure the light-hardened portions of the coating are visible and can be compared with the negative.

The next step in the process is the stripping of the soluble unhardened prepolymer film. This may be done with any of the solvents used to produce the prepolymer solution in the first place. If a water-insoluble intermediate film is used, it is good practice to use a solvent which will dissolve this film as well.

The choice of solvent depends on the preference of the operator. It is advantageous, in some lithographic shops, to use relatively high boiling organic solvents which are water-soluble. Alternatively, a developing tank is used, with a non-flammable volatile solvent. One preferred solvent for the first technique is tetrahydrofurfuryl phosphate. Other excellent developing solvents include aromatic hydrocarbons, chlorinated hydrocarbons, ketones, the glycol ether esters such as the "Cellosolves" and "Carbitol" esters; and emulsions of hydrocarbon solvents in water.

After the development of the image by stripping, the plate is in the condition shown in FIGURE 3. It should be noted in all of the figures that the thickness of the films are much magnified, very thin films of the order of a few hundred-thousandths to a few ten thousandths of an inch being preferably used.

After the plate has been stripped, it is generally wet with a standard so-called plate etch, which comprises water with chemicals which bite very slightly into the metal of the plate to produce an etched surface (20) which holds water. The plate may be inked, and the ink film (22) will adhere readily to the surface of the hardened polymer, permitting proofing of the plate. At this point, the plate is ready for putting on the press and running.

The following typical examples of the invention are given by way of illustration and not by way of limitation.

EXAMPLE 1

A typical formulation for photosensitized coating solution used for making printing plates is prepared as follows:

| | G. |
|---|---|
| Diallylisophthalate prepolymer (Dapon M) | 12 |
| Xylene | 55 |
| Pentoxone (4-methoxy-4-methyl-pentanone-2) | 33 |
| Benzil | 0.1 |
| Michler's ketone | 0.1 |
| Xanthone | 0.4 |

The prepolymer is dissolved in the xylene and the solution refined to remove insoluble fractions by filtration or centrifuging. The photosensitizers, benzil, Michler's ketone, and xanthone, are dissolved in the pentoxone and thoroughly mixed with the polymer solution. The coating solution is then ready for use.

This solution is applied to an aluminum sheet by whirl coating technique to produce a uniform coating 0.1 mil thick. After evaporation of some of the solvent the plate is heated to 125° F. for 5 minutes to remove most of the residual solvent. After cooling, the photosensitive coating is seen as a colorless, dry film on the metal surface.

The coated plate is handled under reduced intensity illumination conventionally used in platemaking shops.

The plate is covered with a negative mask or film transparency and exposed through the mask to a carbon arc, mercury vapor, or other source of ultraviolet light. After exposure, the plate is developed to remove the unhardened polymer by covering the plate with xylene, 1,1,1-trichloroethane, methyl ethyl ketone, trichloroethylene or mixture of similar solvents. A contact time of about one minute is allowed before the developing solvent is flushed away with water. The image, composed of the light-hardened resin, is visible at this point. The hardened polymer image is hydrophobic and sheds water, while the metal plate from which the soluble photosensitive polymer has been removed is fully wetted by water. After rinsing, the surplus water is removed and the plate is next covered with a conventional solution of gum arabic and dilute phosphoric acid. An oil-based developing ink which wets or has an affinity for the hardened polymer may be next rubbed over the plate to show the image for proofreading purposes. A clean, sharp, scum-free plate, which can be used to make multiple impressions by the lithographic printing process, is the result.

A plate made as described, with an image composed of line-work, halftones, and screened tint areas used for printing on a lithographic offset press. At the end of the run, after 250,000 sharp, clear impressions had been obtained, the only wear observed was some sharpening of the dot structure, with no chipping or flaking of the image structure.

EXAMPLE 2

A second type of plate consists of a sandwich of aluminum, a "substrate" coating, a photosensitive diazo coating, and finally a coating of photosensitive diallyl isophthalate prepolymer.

A base plate was prepared, as in U.S. Patent 2,714,066, by cleaning a smooth surfaced aluminum plate with trisodium phosphate solution, which was then neutralized with dilute nitric acid and rinsed clean with water. The sheet was then treated with aqueous sodium silicate, and again washed clean, and then coated with an initially water soluble light sensitive diazo (p-diazodiphenyl amine-formaldehyde) resin. The plate was then overcoated with the xylene solution of Example 1, as in Example 1.

Both the allyl and the diazo coatings are photosensitive. Upon exposure to light under a screened negative, both layers harden. The unhardened diazo compound remains water-soluble. To develop the exposed plate, an emulsion of the following composition is poured over the plate, and smoothed over its surface with a sponge:

| | |
|---|---|
| Aromatic hydrocarbon solvent (B.R. 250–350° F. K.B. No. 80–90) | 25 |
| Water | 75 |
| Triton N-100 (Nonyl phenyl polyethoxy ethanol) | 3 |

A few minutes of development in this manner is sufficient to remove the unhardened photosensitive materials. After a brief water rinse an acidified gum solution is smoothed over the plate. Ink is next applied to show the printing image.

In this example, a means is found to provide development which is as easy and as conventional as that used for an ordinary presensitized or wipe-on diazo plate. However, this plate nevertheless has all the advantages of chemical and abrasion resistance due to its surface layer of hardened allyl prepolymer. Although the diazo coating is known to be sensitive to water vapor during storage, the new plate does not suffer from this disadvantage because the diazo layer is protected from humid conditions with a layer of allyl coating.

EXAMPLE 3

A photosensitized solution of triallyl mellitate prepolymer was prepared in the manner outlined for diallyl isophthalate in Example 1. After applying this coating to an aluminum substrate, it was exposed thrugh a step wedge, and the exposed plate was processed through development as described in Example 1 and rubbed up with preprint black ink. A sensitivity guide number of 8 was obtained under one minute exposure in a Nu-Arc Model FT18A plate maker.

EXAMPLE 4

The same procedure was used with triallyl cyanurate prepolymer. The sensitized coating solution was prepared as in Example 1. Plate exposure development and processing following the procedures of Example 1.

A sensitivity guide number of 11 was obtained when exposed under the conditions in Example 3, indicating that this coating is somewhat more light sensitive than the coating used in Example 3.

EXAMPLE 5

A photosensitized prepolymer solution was made up with the following:

| | G. |
|---|---|
| Diallyl terephthalate prepolymer | 12.0 |
| Xylene | 40.0 |
| Pentoxone | 12.0 |
| 4,4'-bis(dimethylamino)benzophenone | .08 |
| Benzophenone | .4 |
| Benzil | .3 |

The diallyl terephthalate prepolymer was dissolved in the xylene and pentoxone, and the solution filtered through a Buchner funnel with a dicalite filter media until clear.

The solution was then sensitized by adding the 4.4'-bisdimethyl amino benzophenone, benzil, and benzophenone. The solution was flow coated on a 6" x 6" aluminum sheet, allowed to drain dry, and then oven dried for 10 minutes at 110–115° F. Exposure for 3 minutes with a G.E. type H400 ASA H–1LS (400 watt) mercury vapor lamp, 18 inches away and with a conical reflector, produced a satisfactory image.

EXAMPLE 6

Example 5 was reproduced substituting tetraallyl pyromellitate prepolymer for the diallyl terephthalate prepolymer. The tetraallyl pyromellitate prepolymer produced a satisfactory image somewhat more rapidly.

Obviously the examples can be multiplied indefinitely without departing from the scope of the invention which is defined in the claims.

We claim:

1. The method of making an offset printing plate which comprises exposing to actinic radiation a presensitized lithographic printing plate comprising a base material capable of holding water when treated with conventional lithographic plate etch solution, and carrying thereon a photosensitive composition comprising (a) a prepolymer of an aryl allyl ester having more than one allyl group, said prepolymer being a solvent-soluble material which is a solid at ambient temperature, and which undergoes very little shrinkage when further cross-linked by actinic radiation; and (b) sensitizing agents which, upon absorbing actinic radiation at room temperature accelerate polymerization of said prepolymer the exposure time being sufficient to convert the exposed portion of the film to the solvent-insoluble condition, treating the film with a solvent which removes the unhardened portion of the film and then treating the plate with lithographic plate etch and ink, to produce a finished printing plate comprising printing portions of insolubilized polymer, and non-printing portions comprising etched base plate.

2. The method according to claim 1 wherein the prepolymer is derived from a monomer selected from the group consisting of diallyl isophthalate, diallyl terephthalate, triallyl cyanurate, triallyl mellitate, and tetraallyl pyromellitate.

3. The method according to claim 1 wherein the prepolymer is derived from diallyl isophthalate.

4. The method according to claim 1 in which the sensitizing agent is a mixture of benzil, Michler's ketone and xanthone, and the base is aluminum.

5. The method according to claim 1 wherein there is a sensitized diazo layer between the base and the prepolymer resist composition.

References Cited

UNITED STATES PATENTS 3,376,138 4/1968 Giangualano et al. 96—115 XR
3,376,139 4/1968 Giangualano et al. 96—115 XR NORMAN G. TORCHIN, Primary Examiner
RONALD H. SMITH, Assistant Examiner U.S. Cl. X.R.

96—35.1; 101—456; 260—78.4